(12) United States Patent
Clifton et al.

(10) Patent No.: US 8,263,466 B2
(45) Date of Patent: Sep. 11, 2012

(54) CHANNEL STRAIN INDUCED BY STRAINED METAL IN FET SOURCE OR DRAIN

(75) Inventors: Paul Clifton, Menlo Park, CA (US); Daniel J. Connelly, San Francisco, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 33 days.

(21) Appl. No.: 12/253,835

(22) Filed: Oct. 17, 2008

(65) Prior Publication Data
US 2009/0104746 A1   Apr. 23, 2009

Related U.S. Application Data

(60) Provisional application No. 60/980,740, filed on Oct. 17, 2007.

(51) Int. Cl.
*H01L 21/336* (2006.01)
(52) U.S. Cl. ........ 438/299; 438/291; 438/149; 438/581; 257/328; 257/369
(58) Field of Classification Search .................. None
See application file for complete search history.

(56) References Cited

U.S. PATENT DOCUMENTS

| 6,236,083 B1 * | 5/2001 | McLachlan | 257/328 |
| 2004/0220057 A1 * | 11/2004 | Ference et al. | 505/100 |
| 2006/0084232 A1 | 4/2006 | Grupp | |
| 2006/0163670 A1 * | 7/2006 | Ellis-Monaghan et al. | 257/388 |
| 2006/0220113 A1 * | 10/2006 | Tamura et al. | 257/335 |
| 2007/0069294 A1 * | 3/2007 | Chidambarrao et al. | 257/351 |
| 2007/0224739 A1 * | 9/2007 | Faulkner et al. | 438/149 |

OTHER PUBLICATIONS

Thompson et al. IEEE Transactions on Electron Devices, vol. 51, No. 11, p. 1790 (2004).*
Kedzierski et al. IEEE IEDM Transactions, p. 57-60 (2000).*
Ge et al. IEEE IEDM Transactions, p. 73-76 (2003).*
Kinoshita et al. IEEE IEDM Transactions, pp. 71-74 (2006).*
Ang, Kah Wee et al., Enhanced Performance in 50 nm N-MOSFETs with Silicon-Carbon Source/Drain Regions, IEEE IEDM Transactions, pp. 1069-1071 (2004).
Kedzierski, Jakub et al., Fabrication of Metal gated FinFETs Through Complete Gate Silicidation with Ni, IEEE Transactions on Electron devices, vol. 51, No. 12, Dec. 2004.
Kedzierski, Jakub et al., Complementary silicide source/drain thin-body MOSFETs for the 20nm gate length regime, IEEE IEDM Transactions, pp. 57-60 (2000).
Kehr, Shreyas S. & Spencer, James T., Chemical Vapor Deposition of Metal Borides: The relatively low temperature formation of crystalline lanthanum hexaboride thin films from boron hydride cluster compounds by chemical vapor deposition, J. Phys. Chem. Solids, vol. 59, No. 8, pp. 1343-1351 (1998).
Kinoshita, T. et al., Ultra Low Voltage Operations in Bulk CMOS Logic Circuits with Dopant Segregated Schottky Source/Drain Transistors, IEEE IEDM Transactions, San Francisco, CA, Dec. 11-13, 2006.

(Continued)

*Primary Examiner* — Julio J Maldonado
*Assistant Examiner* — Shantanu C Pathak
(74) *Attorney, Agent, or Firm* — Tarek N. Fahmi, APC

(57) ABSTRACT

A process for forming a FET (e.g., an n-FET or a p-FET), in which during formation a metal which makes up a source or drain of the transistor is stressed so that stress is induced in a semiconductor channel of the transistor.

7 Claims, 3 Drawing Sheets

OTHER PUBLICATIONS

Kinoshita, A. et al., Comprehensive Study on Injection Velocity Enhancement in Dopant-Segregated Schottky MOSFETs, IEEE IEDM Transactions, San Francisco, CA, Dec. 11-13, 2004.

Kuzanyan, Armen et al., High-Z Lanthanum-Cerium Hexaborate Thin Films for Low-Temperature Applications, Mat. Res. Soc. Symp., vol. 626, pp. Z8.21.1-Z8.21.6 (2000).

Nakano, T. et al., Structure modification of radio frequency sputtered LaB6 thin films by internal stress, J. Vac. Sci. Technol., A9 (3), pp. 547-549 May/Jun. 1991.

Shimazu, Hiromi & Miura, Hiedo, Mechanical-Stress-Controlled Silicide Interconnections for Highly reliable Semiconductor Devices, Mat. Res. Soc. Symp. Proc., vol. 716, pp. B13.5.1-B13.5.6 (2002).

Thompson, Scott E., et al., A 90-nm Logic Technology Featuring Strained-Silicon, IEEE Transactions on Electronic Devices, vol. 51, No. 11, pp. 1790-1797 Nov. 2004.

Windischmann, H., Intrinsic stress in sputtered thin films, J. Vac. Sci. Technol., A9 (4), pp. 2431-2436 Jul./Aug. 1991.

Yagishita, Atsushi et al., Schottky Barrier height Reduction and Drive Current Improvement in Metal Source/Drain MOSFET with Strained-Si Channel, Japanese journal of Applied Physics, vol. 43, No. 4B, pp. 1713-1716 (2004).

* cited by examiner ically deposited semiconductor alloys in the source and drain to induce strain in the intervening channel. For example, Ge—Si alloy formed in trenches etched in the source and drain of a FET can induce compressive strain in a silicon channel (see, e.g., Thompson, et al., IEEE Transactions on Electron Devices, vol. 51, no. 11, p. 1790 (November 2004)). Or, for example, Si—C alloy can be epitaxially formed in trenches etched in the source and drain of a field-effect transistor (FET) to induce tensile strain in the channel (see, e.g., Ang, et al., IEEE IEDM Transactions, p. 1069 (2004)). These alloys may fully serve as the source and drain, or may be embedded within a larger source or drain, where the edge of the source is defined as the region directly providing electrons or holes to the channel, and the edge of the drain is defined as the region directly receiving electrons or holes from the channel, with electrons applicable to n-channel FETs, or with holes applicable to p-channel FETs.

CHANNEL STRAIN INDUCED BY STRAINED METAL IN FET SOURCE OR DRAIN

RELATED APPLICATION

This is a NON-PROVISIONAL of and claims priority to U.S. Provisional Patent Application No. 60/980,740, filed 17 Oct. 2007, incorporated herein by reference

FIELD OF THE INVENTION

The present invention relates to a process for forming a field-effect transistor (FET), in which a metal source or drain thereof is at some time in the formation process strained, such that stress is induced in a semiconductor channel.

BACKGROUND

It has been common practice in the art of semiconductor fabrication to use strained epitaxially deposited semiconductor alloys in the source and drain to induce strain in the intervening channel. For example, Ge—Si alloy formed in trenches etched in the source and drain of a FET can induce compressive strain in a silicon channel (see, e.g., Thompson, et al., IEEE Transactions on Electron Devices, vol. 51, no. 11, p. 1790 (November 2004)). Or, for example, Si—C alloy can be epitaxially formed in trenches etched in the source and drain of a field-effect transistor (FET) to induce tensile strain in the channel (see, e.g., Ang, et al., IEEE IEDM Transactions, p. 1069 (2004)). These alloys may fully serve as the source and drain, or may be embedded within a larger source or drain, where the edge of the source is defined as the region directly providing electrons or holes to the channel, and the edge of the drain is defined as the region directly receiving electrons or holes from the channel, with electrons applicable to n-channel FETs, or with holes applicable to p-channel FETs.

The resulting strain may be beneficial to electron or hole transport through a semiconductor (see, e.g., Thompson, supra), or to the transport of electrons or holes between a metal and a semiconductor (see, e.g., Yagishita, et al., Japanese Journal of Applied Physics, vol. 43, no. 4B, pp. 1713-1716 (2004)). For example, in Si devices, there is typically a significant advantage for stresses of at least approximately 50 MPa, although the advantage of stress can continue to increase to beyond 1 GPa.

SUMMARY OF THE INVENTION

In various embodiments, the present invention provides a process for forming a FET (e.g., an n-FET or a p-FET) such that during the formation process, a metal which makes up a source or drain of the transistor is stressed so that stress is induced in a semiconductor channel of the transistor.

BRIEF DESCRIPTION OF THE DRAWINGS

Embodiments of the present invention are illustrated by way of example in the accompanying drawings, in which.

DETAILED DESCRIPTION

Figure 1:
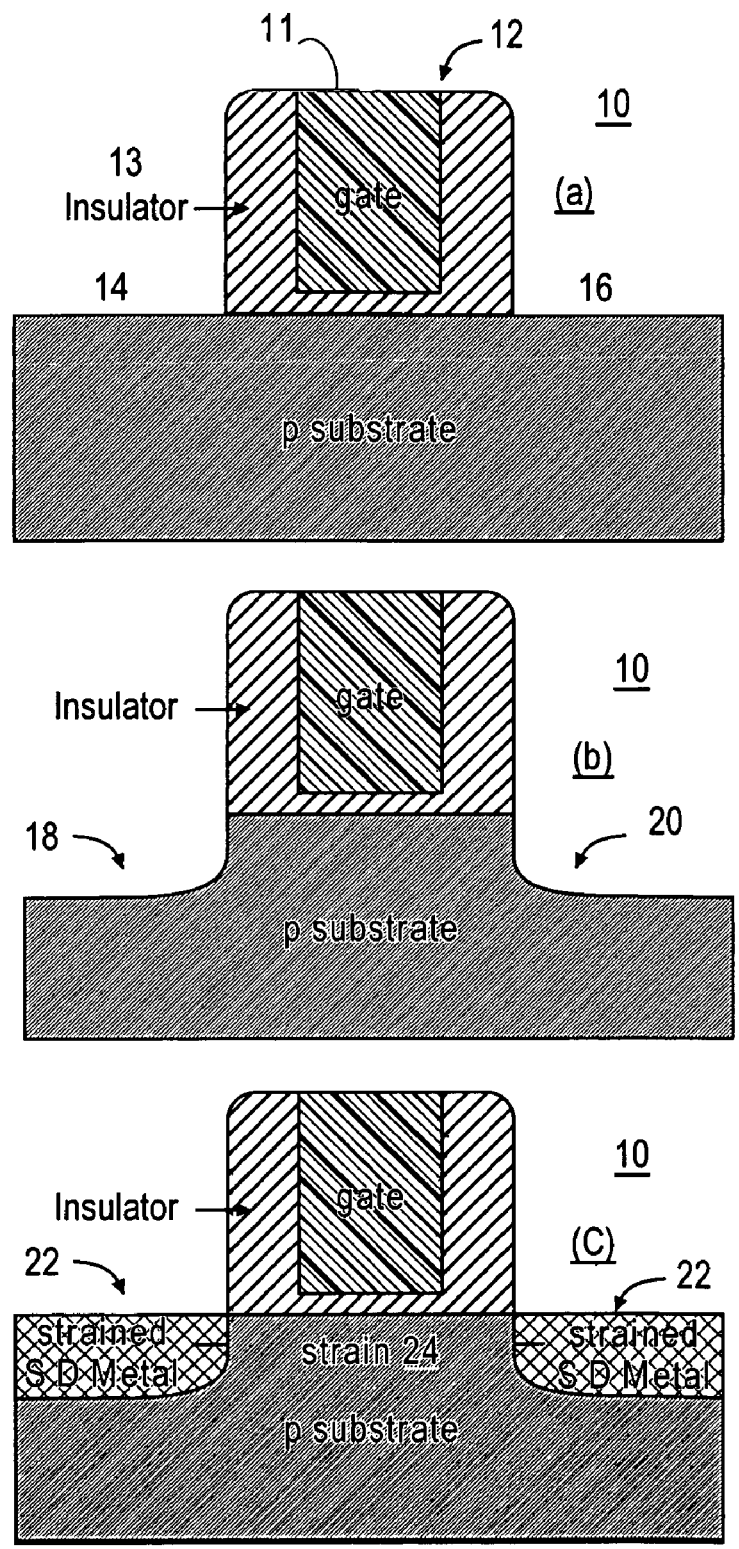
FIG. 1 presents a schematic illustration of a process for forming a FET in accordance with an embodiment of the present invention.

Described herein are processes for forming a FET, in which a metal source or drain thereof is, at some time in the formation process, strained so that stress is induced in a semiconductor channel. In accordance with an embodiment of the present invention, one or more recess(es) for source(s)/drain(s) are etched. Thereafter, a strained metal is deposited in the recess(s), possibly in conjunction with other material(s), forming the source(s) and/or drain(s) of the FET. The etching of the trenches can be done after the formation of a gate stack (e.g., made up of a gate insulator, a gate electrode or a "dummy gate" that is subsequently replaced, and gate encapsulation, including spacers) as part of a self-aligned process. A schematic illustration of such a process is shown in FIG. 1 and discussed in greater detail below.

Before beginning that discussion, however, it is helpful to recognize that we have previously proposed (Grupp, et al., US PGPUB 2006-0084232, assigned to the assignee of the present invention and incorporated herein by reference) a process whereby recesses are first formed in the source and/or drain of a FET, and then subsequently filled with one or more materials, including a metal, forming a self-aligned source or drain. Depositing a metal as a source and/or drain affords the possibility of inducing strain in the channel by straining this metal.

Metal strain depends on the conditions and method of deposition. For example, various methods of deposition include sputtering, evaporation (thermal or electron beam), and chemical deposition. Energetic sputtering may preferentially result in compressive strain, as energetic ions are forced into already-deposited metal, increasing the number of atoms per unit volume above the equilibrium value, and also by "atomic peening", whereby atoms within the film recoil from near the surface when struck by energetic particles. Meanwhile, evaporation, or low-energy sputtering at sufficiently high gas pressure, may tend to result in tensile strain, as multi-atom clusters of atoms, with relatively less velocity, are deposited on a surface, and as these clumps accumulate, redistribution tends to stretch bond beyond the equilibrium length, to allow the bonding of atoms at the surfaces of adjacent clumps (see, e.g., Windischmann, Journal of Vacuum Science Technology A, 9 (4), p. 2431 (1991)).

Alternatively, the metal may be formed by the reaction of a metal with another material, for example a semiconductor, for example the same semiconductor forming the channel region, for example silicon or an alloy of silicon (forming a metal silicide), which for appropriate conditions can result in a strained reaction product. For example, if the volume available to the reaction product is appropriately constrained by surrounding structures, the reaction product may be compressed.

Or, for any of these techniques, if the film is deposited or otherwise formed at a temperature which differs from the ultimate operating temperature of the resulting device, or if the sample is subsequently exposed to an elevated temperature, and a boundary of the metal is then relatively constrained, differences in the rate of thermal expansion or contraction may result in a residual stress in the source/drain metal. Or, for example, strain may be affected by stoichiometric variation of compound metals, or via variation in alloy composition. Or, strain may be the result of a combination of these mechanisms. For example, metal may be first formed via chemical vapor deposition, then further evaporated, at elevated temperature, then subsequently cooled to the ultimate device operating temperature, resulting in a superposition of stress components, from evaporation, possibly from the chemical vapor deposition, and from thermal expansion/contraction. Or, a metal may be deposited in a strained state, then implanted with an impurity to further increase the strain. An example of strain induced by a metal silicide, enhanced by cooling after the reaction, is given in Shimazu, et al., Mat. Res. Soc. Symp. Proc. Vol. 716, p. B.13.5.1 (2002).

An example of a metal which may serve as a FET source or drain is $LaB_6$, a rare earth hexaboride, as it has a combination of chemical stability and low workfunction, the latter affording the promise of a low Schottky barrier for electrons in combination with a semiconductor channel for an n-channel FET. Stress in sputtered $LaB_6$ has been shown to be dependent on sputter pressure and temperature (see, e.g., Nakano, et al., Journal of Vacuum Science and Technology A, 9 (3) p 547 (1991)). Evaporated $LaB_6$ (or alloys of consisting primarily of $LaB_6$) can be formed with tensile stress (see, e.g., Kuzanyan, et al., Mat. Res. Soc. Symp. Vol. 626, Z8.21.1 (2000)).

Now turning to FIG. 1 a schematic cross-section of exemplary bulk process is shown. More specifically, illustration (a) of FIG. 1 shows a FET 10 with a gate stack 12 (including a gate material 11 and an insulator 13) in place, and the source and drain regions 14, 16, exposed. In illustration (b) of FIG. 1, trenches 18, 20, have been etched in the source and drain regions. In illustration (c) of FIG. 1, the trenches have been filled with strained source/drain (S/D) metal 22, transferring strain to the channel region 24 between the source and drain (the transfer of strain represented with arrows).

Figure 2:
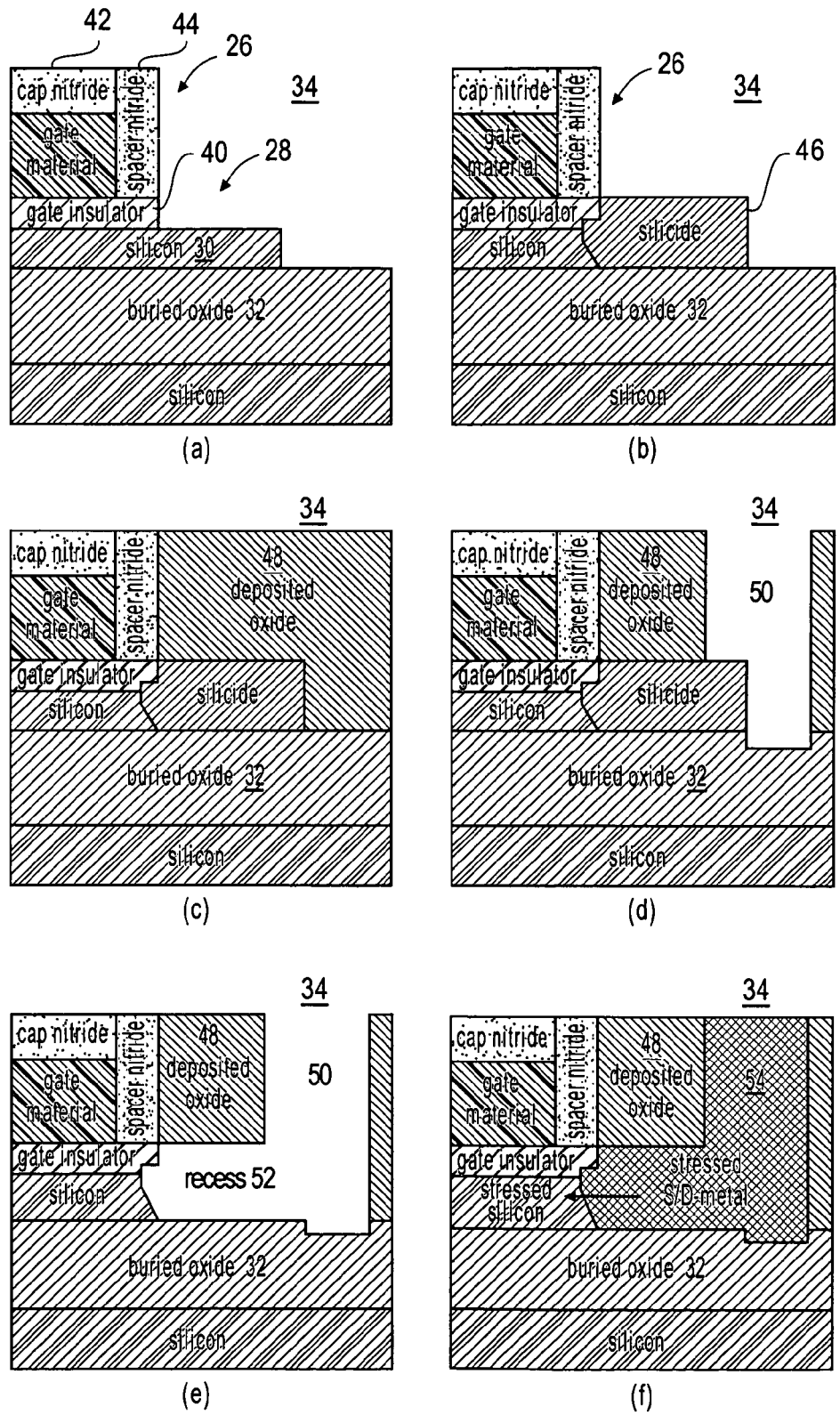
FIG. 2 illustrates a further example of a process for forming a thin-body fully-depleted silicon-on-insulator (FDSOI) FET.

A more elaborate example is shown in FIG. 2, which illustrates a thin-body fully-depleted silicon-on-insulator (FD-SOI) process for creating a FET. This is a derivative of a process described in Grupp, et al., US PGPUB 2006-0084232. "Thin-body" in this case corresponds to a device in which alternate current paths to the channel are suppressed by the use of a very thin semiconductor layer, where the gate is essentially able to control the electrostatic potential throughout the full semiconductor thickness, rather than relying on ionized impurities in the silicon to suppress current paths other than the channel. In this example, a thin Si layer 30 is oriented on an underlying, "buried" $SiO_2$ layer 32.

Various process steps for the subject device 34 are presented in FIG. 2 and illustration (a) thereof shows the starting structure. Each illustration, (a) through (f), shows a half cross-section of the device, with the half cross-section showing half of a "cut" between the source and the drain perpendicular to a gate. Each cross-section is considered to be symmetric about the left edge. Thus, half the gate stack 26 is shown, and only one of the source/drain regions 28 is shown.

The cross-section shows an n-FET, although the present invention applies equally well to a p-FET. The silicon region 30 is of sufficiently low impurity concentration that the device operate in a fully-depleted mode, and that the gate(s) can control the potential throughout the underlying silicon. The isolation between devices is achieved via the use of a "field oxide", not shown in these illustrations, but labeled 56 in the illustrations that make up FIG. 3. The gate 38 is a conductor which may be, for example, a metal, a semi-metal, or a semiconductor which, by the end of the process, will possess a relatively high concentration of ionized impurities such that it exhibits the characteristics of a conductor. The gate is separated from the channel 36 by a gate insulator 40. A cap nitride 42 protects the top of the gate, and the side of the gate is protected by a "spacer nitride" 44. The use of the term "nitride" implies these are formed of $Si_3N_4$, although one or more other insulators may be used, in combination with or instead of $Si_3N_4$. The substrate is indicated as p+Si, although the details of the substrate 46 are unimportant to the present example. Note part of the thin Si layer 30 is exposed. This is the area which corresponds to a source or drain. Collectively, the gate 38, gate insulator 40, nitride cap 42 and spacer 44 are collectively referred to as a gate stack 26.

In illustration (a) of FIG. 2 then, gate stack 26 has been formed and source and drain regions 28 exposed. Then, referring to illustration (b) of FIG. 2, a sacrificial silicide 46 is formed by reacting the exposed silicon with a metal. In this particular case a silicidation (reaction of a metal with exposed silicon), has been used to consume the silicon in the source and drain region 28. Then, the silicide is capped with a deposited oxide 48 (see illustration (c) of FIG. 2), and a hole 50 is etched through the oxide, exposing a component of the silicide (see illustration (d) of FIG. 2).

Next, the silicide is selectively etched away, creating a recess 52, as shown in illustration (e) of FIG. 2. Finally, the recess is filled with a strained metal 54, for example by chemical vapor deposition (CVD). Tensile strain is transferred to the silicon in the channel region. Alternately, if the metal were formed to have compressive strain, compressive strain could be transferred to the silicon in the channel region. In illustration (f) of FIG. 2, an arrow indicates the transfer of stress and strain.

An alternative to inducing strain in the direction perpendicular to the plane of the interface between the metal and the semiconductor, of the same type as the strain in the metal, is to induce strain along the plane of the interface of the opposite type as the strain of the metal. When a strained film is deposited on an initially unstrained thin film, if the lateral boundaries of the two films are relatively unconstrained, the strained film may partially relax, transferring strain to the initially unstrained film. Likewise, if a strained metal is deposited on the semiconductor surface, and if the boundaries are sufficiently free, stress along the plane of the interface can be generated in the semiconductor. This strain may be desirable, for example, for decreasing the potential barrier for current flow between the metal and the semiconductor.

A further special case of the present process is a complementary process, with both n-channel and p-channel FETs created. For example, n-channel FETs (n-FETs) may be formed with a metal under a state of tensile strain, for example with a relatively low workfunction, while p-channel FETs (p-FETs) may be formed with a metal under a state of compressive strain, for example with a relatively high workfunction, with channel regions comprising silicon. This would allow for longitudinal tensile stress the n-FET channels, with longitudinal compressive stress in the p-FET channels, in each case beneficial to carrier transport in the respective device in the case of silicon channels with a (001) channel surface and transport in a (110) direction (see Thompson, supra). "Longitudinal" in this context implies in the direction of current flow between a source and drain.

As was noted above, the edge of the source is defined as the region supplying carriers to the channel, while the edge of the drain is defined as the region receiving carriers from the channel. If the material in one of these regions is metallic, this constitutes a "metal source" or a "metal drain". A special case of the present invention is one in which there is a metal source or drain, and the metal serving as the edge of the source or drain is at some time in the process strained, contributing to the strain in the channel. This metal need not be in direct contact with the semiconductor to function as a source or drain. For example, it my be separated from the semiconductor by a thin separation layer, for example an insulator, through which carriers can readily tunnel. Such a separation layer may be advantageous by reducing deleterious metal-semiconductor interactions.

The metal proximate to the semiconductor channel, serving as the source or drain, need not be the metal of maximal strain. For example, the source or drain metal may be capped with a second metal, the second metal transferring strain to the semiconductor channel through the first metal. Or, the source or drain metal may be capped with multiple metals, one or more of which transferring strain to the semiconductor channel. For example, there may be a barrier metal imposed between the source or drain metal and a strained metal, for the purpose of chemical stability. Or, a metal may serve as an adhesion promoter, decreasing the opportunity for delamination.

The present invention may be particularly advantageous in the case of a metal source or drain, as in such a device, the metal may be closely proximate to the channel region, and thus be advantageously situated to transfer stress to the channel region. The most successful examples to date of a metal source/drain transistor have used metal silicides as the source and drain with a silicon channel. For example, $ErSi_{1.7}$ was used for n-channel FETs, with PtSi for p-channel FETs, by Kedzierski, et al., IEEE IEDM Transactions, pp. 57-60 (2004). However, the inventors are not aware of any use of a metal silicide source or drain to induce strain in a FET channel.

A metal silicide source/drain may be combined with a thin layer of ionized impurities (dopants) at the interface with the semiconductor to decrease the height of, or reduce the lateral dimension of, a Schottky barrier that inhibits the transport of carriers between the metal silicide and the channel. See, for example, Kinoshita, et al., IEEE IEDM Transactions, pp. 71-74 (2006). However, the presence of a sufficiently thin doped region proximate to the interface may still result in what is considered for purposes of the present invention a "metal source or drain", as long as the majority of carriers are exchanged directly between the channel and a metal, rather than between a channel and a doped source or drain, and additionally between the doped source or drain and a metal. The key is whether the doped region is sufficiently thick that electric fields from the channel are to a substantial majority screened from the metal interface, or whether it is sufficiently thick that a substantial majority of carriers (for example electrons for an n-channel FET, holes for a p-channel FET) traveling between the channel and the metal interface scatter in the doped region. If either of these conditions are not met, for the purposes of the present invention, the source or drain is a metal source or drain.

A special class of FET for which the present technology may also be particularly advantageous is thin-body devices, in which the channel is formed in a relatively thin semiconductor layer, for example on an insulating substrate (for example, silicon-on-insulator), on a thin "fin" (for example, a FinFET, a Tri-gate FET, or an Omega-FET), or, for example, a semiconductor wire (for example, a "gate all-around", or "nanotube", or "nanowire" FET). In these devices, the silicon may be relatively less constrained, for example because it is bordered by empty space at its edges, or that it is bordered by a relatively less stiff material, for example Si on SiO2. Thus a particularly preferred embodiment of the technology is a thin-body metal source/drain FET.

This method may be combined with other methods at inducing stress in the channel region. For example, longitudinal stress induced by the present invention may be combined with transverse stressed induced by a stressed insulator filling an isolation trench at channel edges. Or, the longitudinal stress induced by the present invention may be combined with principally biaxial stress from the starting substrate material, for example, strained silicon on insulator. Or, the longitudinal stress induced by the present invention may be enhanced with stress induced in subsequent processing, for example with a stressed $Si_3N_4$ layer deposited later.

When combined with an initially stressed semiconductor, for example "strained silicon on insulator", the present invention may be particularly beneficial, since stress normal to an etched surface tends to relax, reducing this normal stress proximate to the etched surface. This loss of stress may be compensated by stress induced by a metal filling the recess, as the stress induced by the metal, in the semiconductor, may be relatively strong proximate to the etched surface.

There exist several mechanisms which may limit the degree of strain which can be transferred from a metal to a semiconductor channel. For example, many metals are described by a yield strength and an ultimate strength. The yield strength describes a tensile stress at which the metal plastically deforms, limiting the amount of further stress which can be generated. When the stress reaches an ultimate stress, the metal can fracture.

Furthermore, the metal should have sufficient adhesion with the semiconductor surface, or with a layer separating the metal from the semiconductor surface (likewise, a separation layer must have sufficient adhesion with the semiconductor surface). If a metal with a tensile stress which exceeds the adhesion strength of a critical interface, the interface may delaminate, breaking the transfer of strain into the semiconductor, and possibly, in the case of an interface proximate to the semiconductor channel, breaking the electrical connection.

For compressive stress, if the metal fails to sufficiently adhere with the underlying material, for example $SiO_2$ in the example of FIG. 2, there is the opportunity for the metal to delaminate at this interface, and buckle, reducing the stress available to transfer to the semiconductor channel. This buckling may occur toward the middle of the metal film, or at an edge, the latter case if there is insufficient adhesion between the metal and a material at its edge, for example $Sio_2$, a semiconductor, or a separation layer. Or a separation layer may delaminate from a semiconductor. These failures may result in a reduction in transferred strain, or in a total failure of the device.

An example of adhesion between a compressively stressed, sputtered metal and an oxide is reported by Kajiwara et al., Vacuum, vol. 41, no. 4-6, pp. 1224-1228 (1990). There, sputtered $LaB_6$ layers with compressive strains from 0.2 to 2.7 GPa were reported, where adhesive strength varied from 0.9 to 1.15 GPa. For the most compressive films, stress exceeded tensile stress, and they delaminated. However, adhesive strength was sufficient to still support a substantial degree of $LaB_6$ compressive stress.

Thus, characteristics of embodiments of the present invention include the following:

1. The metal has a sufficient degree of stress. For example, 100 MPa would provide benefit to silicon-channel FETs, while 1 GPa would be of substantial benefit.
2. For tensile stress, the metal, and proximate materials, possess both sufficient yield strength and sufficient ultimate strength to support stresses during and after processing.
3. The series of interfaces between the metal and the semiconductor forming the channel region have sufficient adhesive strength.
4. Either the series of interfaces between the metal and the underlying substrate, or the series of interfaces at other edges of the metal, have sufficient adhesive strength.
5. In the case of a metal with compressive stress, there is adequate resistance to buckling, where contributing factors to buckling resistance include adhesive strength of interfaces between the metal and the underlying substrate, adhesive strength of interfaces at the edges of the metal (including at the edge(s) closes to the semiconductor channel), the thickness of the metal, and the Young's modulus (stiffness) of the metal.

6. In the case of a metal with compressive stress, if the metal is relatively more confined at interfaces in addition to the interface proximate to the semiconductor channel region, it may be possible that a greater degree of stress can be transferred to the semiconductor channel region. Confinement may further reduce the susceptibility of the structure to delamination, as metal displacement may be inhibited, even without strong adhesion at all interfaces. FIG. 2 shows an example of a relatively confined metal, in the vicinity of its interface with the silicon. Another example of such confinement is a "dovetail joint" shape.

Figure 3:
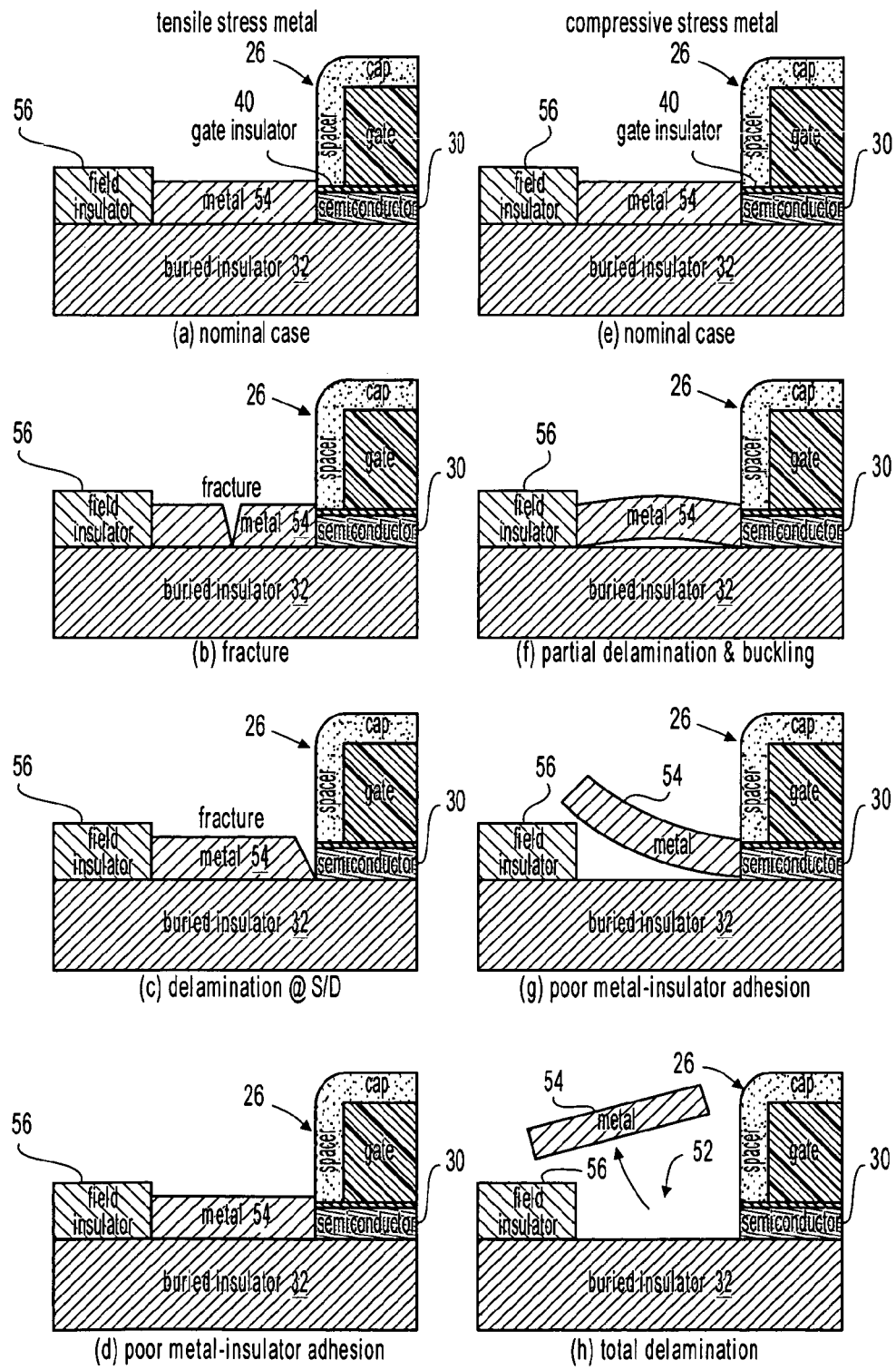
FIG. 3 shows examples of stress-related failures.

FIG. 3 shows examples of stress-related failures. These examples highlight the importance of both sufficient adhesion between metals and adjacent materials, and sufficient ultimate strength of the metal. In particular, FIG. 3 presents illustrations of various stress-related failures for tensile-strained and compressive-strained metal with a FDSOI FET (shown in half cross-section) as follows:

i. Illustration (a) of FIG. 3 shows the nominal case for tensile stress with adequate adhesion.
ii. Illustration (b) of FIG. 3 shows ultimate failure of the metal 54 and a resulting stress-reducing fracture.
iii. Illustration (c) of FIG. 3 illustrates how inadequate adhesion at the semiconductor 30 facilitates a delamination that breaks the mechanical and electrical connection between the metal 54 and the semiconductor 30.
iv. Illustration (d) of FIG. 3 shows how inadequate adhesion at the buried and field insulators 32, 56, results in stress-reducing delamination.
v. Illustration (e) of FIG. 3 illustrates the nominal case for compressive stress with adequate adhesion.
vi. Illustration (f) of FIG. 3 shows how inadequate adhesion with the buried insulator 32 allows for metal buckling, which reduces stress.
vii. Illustration (g) of FIG. 3 shows an example of adhesion failure at both the buried insulator 32 and the field insulator 56, resulting in a partial removal of the metal 54, relieving stress.
viii. Illustration (h) of FIG. 3 shows delamination of the metal 54 at all surfaces, allowing it to eject from the recess 52.

Additional characteristics beneficial to metals used in a source or drain of a FET, whether or not stressed or strained, include the following:

1. The metal possesses sufficient conductivity that its contribution to series resistance is a small fraction of the total resistance of the device in its maximal on-state for anticipated operating conditions.
2. The metal is chemically stable with adjacent materials under conditions experienced both in subsequent processing and in anticipated operation.
3. The metal, if at the edge of the source or drain, exhibits a low effective Schottky barrier for electrons with the channel for an n-channel FET, or a low effective Schottky barrier for holes with the channel for a p-channel FET. This generally gives preference to low-workfunction metals for n-channel FETs, or high-workfunction metals for p-channel FETs.
4. The metal can be deposited in a relatively conformal fashion, sufficiently covering critical surfaces, for example if the metal is serving as the source of carriers to the channel or the drain of carriers from the channel, the metal should deposit on a surface sufficiently proximate to the semiconductor channel. An example of a conformal metal deposition process is chemical vapor deposition, for example of $LaB_6$ (Kher, et al., J. Phys. Chem Solids Vol 59, No. 8, pp. 1343-1351 (1998)).

Thus, processes for forming a FET, in which a metal source or drain thereof is, at some time in the formation process, strained so that stress is induced in a semiconductor channel have been described. Although the present invention was described with respect to certain illustrated embodiments, it should be remembered that these were intended only as examples. In general, embodiments of the present invention provide a process for forming a FET (e.g., an n-FET or a p-FET) such that during the formation process, a metal which makes up a source or drain of the transistor is stressed so that stress is induced in a semiconductor channel of the transistor. In various instances, the stress in the metal, at some point in the process, may be at least 100 MPa. Or at least 500 MPa Alternatively, or in addition, for a position within the semiconductor channel of the transistor, a difference in stress relative to a case where all metals in the source/drain are unstressed, may be at least 100 MPa at the end of the process, or may be at least 500 MPa at the end of the process.

In various instances of the invention, the metal may be compressively stressed, such that compressive stress is induced in the semiconductor channel. Alternatively, the metal may be under tensile stress, such that tensile stress is induced in the semiconductor channel.

In various instances, the metal may be deposited, for example in a recess adjacent the semiconductor channel. Alternatively, the metal may be formed via sputtering and may, as a result, be in a state of compressive stress. Or, the metal may be formed via evaporation and, as a result, be in a state of tensile stress. Or, the metal may be formed via chemical deposition.

In some cases, the metal is formed with a surplus of at least one element relative to its stoichiometric atomic fraction, such that stress in the metal is increased relative to a case of a stoichiometric atomic fraction of that element. Or the metal may be formed at a temperature exceeding a temperature to which the transistor is subsequently exposed, such that thermal expansion or contraction induces stress in the metal, and said stress is eventually transferred into the semiconductor comprising a channel of the transistor.

In some cases, subsequent to deposition of the metal that makes up the source or drain, one or more impurities may be implanted into the metal, inducing a change in the stress of the metal. Such stress in the metal may be compressive, and the compressive stress subsequently transferred to the semiconductor channel of the transistor.

In still further embodiments of the invention, the metal may be formed via a chemical reaction between a desired metal and a semiconductor that makes up the semiconductor channel. For example, the desired metal may be deposited on the semiconductor, then reacted therewith. Unreacted portions of the desired metal may subsequently be fully removed.

Where the transistor is an n-FET, the metal may have a workfunction less than an affinity of a semiconductor that makes up the semiconductor channel. For example, the metal may be a rare earth hexaboride, e.g., $LaB_6$. Where the transistor is a p-FET, the metal may have a workfunction greater than an ionization potential of a semiconductor that makes up the semiconductor channel of the transistor. For example, the metal may be Pt or Ir, or a compound of Pt or Ir. In either instance, the metal may transfer longitudinal compressive stress into the semiconductor channel, which, as discussed above, may be made of Si.

The transistor formation process may be a complementary process, with n-channel FETs having respective sources and drains in one stress state, and p-channel FETs having respective sources and drains in a different stress state. For example, the n-channel FETs may have respective source and drain metals in a state of tensile stress while the p-channel FETs may have respective sources and drains in a state of compressive stress.

Either or both of the source/drain may be a metal source/drain and the metal which serves as the source/drain may be separated from the semiconductor channel by an additional layer. The metal serving as the source/drain is, at some point in the process, strained, and contributes to the stress in the semiconductor channel. In some instances, the metal which serves as the source/drain may be capped with one or more other materials, including a strained metal which then induces stress in the semiconductor channel. In other instances, the metal is deposited in conjunction with deposition or formation of one or more adhesion promotion layers, where an adhesive strength between the metal and the adhesion promotion layer, and an adhesive strength between the adhesion promotion layer and a material onto which it was deposited or formed, exceeds an adhesive strength between the metal and the material onto which the adhesive promotion layer was deposited or formed.

In some cases, the transistor is a thin-body FET, in which an interface between the metal and the semiconductor channel extends through a full dimension of the semiconductor channel. The semiconductor channel may be formed on an insulating substrate and may be fully absent between the metal and the insulating substrate, over most of the metal.

In some instances, the metal, following deposition, and at a time in the process in which the metal is under as great a degree of stress as it is at any time following such deposition, may be confined in three orthogonal directions about a point proximate an interface proximate to the semiconductor channel. The stress in the metal may be primarily compressive in such instances and the metal may be deposited into a recess such that, following completion of the deposition, the metal is confined in the recess. Following completion of the deposition, at a temperature of ultimate device operation, the stress in the metal is compressive.

What is claimed is:

1. A complementary process for forming field-effect transistors (FETs), comprising forming n-channel FETs having respective semiconductor channels in a tensile stress state and p-channel FETs having respective semiconductor channels in a compressive stress state, each of the respective n-channel transistors having a metal source/drain with a workfunction less than an affinity of a semiconductor that makes up the semiconductor channel of the respective n-channel transistor and each of the p-channel transistors having a respective metal source/drain with a workfunction greater than an ionization potential of a semiconductor that makes up the semiconductor channel of the respective p-channel transistor, wherein in each transistor instance, during the formation process, stress is induced in respective semiconductor channels of each respective n-channel or p-channel transistor by a strained capping metal which caps the metal source/drain of the respective n-channel or p-channel transistor and induces stress in each respective semiconductor channel.

2. The process of claim 1, wherein stress in the metal source/drain of a respective transistor, at some point in the process, is at least 100 MPa.

3. The process of claim 1, wherein for a position within the semiconductor channel of a respective transistor, a difference in stress relative to a case where all metals in the source/drain were unstressed, is at least 100 MPa, at the end of the process.

4. The process of claim 1, wherein the stress in the metal source/drain of a respective transistor, at some point in the process, is at least 500 MPa.

5. The process of claim 1, wherein for a position within a semiconductor channel of a respective transistor, a difference in stress relative to a case where all metals in the source or drain were unstressed, is at least 500 MPa, at the end of the process.

6. The process of claim 1, wherein the metal source/drain of the respective transistors is separated from the respective semiconductor channels of the respective transistors by an additional layer.

7. The process of claim 1 wherein the metal source/drain of the respective transistors is, at some point in the process, strained, and contributes to the stress in the respective semiconductor channels of the respective transistors.

* * * * *